United States Patent
Yang et al.

(10) Patent No.: US 11,847,399 B2
(45) Date of Patent: Dec. 19, 2023

(54) INTEGRATED CIRCUIT WITH ASYMMETRIC MIRRORED LAYOUT ANALOG CELLS

(71) Applicant: TAIWAN SEMICONDUCTOR MANUFACTURING COMPANY, LTD., Hsinchu (TW)

(72) Inventors: Yu-Tao Yang, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 184 days.

(21) Appl. No.: 17/307,122

(22) Filed: May 4, 2021

(65) Prior Publication Data
US 2021/0256194 A1    Aug. 19, 2021

Related U.S. Application Data

(62) Division of application No. 16/219,573, filed on Dec. 13, 2018, now Pat. No. 10,997,354.

(60) Provisional application No. 62/644,280, filed on Mar. 16, 2018.

(51) Int. Cl.
*G06F 30/39* (2020.01)
*G06F 30/398* (2020.01)
*G03F 1/36* (2012.01)
*G06F 30/392* (2020.01)

(52) U.S. Cl.
CPC .............. *G06F 30/398* (2020.01); *G03F 1/36* (2013.01); *G06F 30/39* (2020.01); *G06F 30/392* (2020.01)

(58) Field of Classification Search
CPC ...... G06F 30/398; G06F 30/39; G06F 30/392; G06F 30/396; G03F 1/36; H01L 27/0207; H01L 27/0203
USPC ......................................................... 716/100
See application file for complete search history.

(56) References Cited

U.S. PATENT DOCUMENTS

| | | | |
|---|---|---|---|
| 7,260,442 | B2 | 8/2007 | Hwang et al. |
| 9,256,709 | B2 | 2/2016 | Yu et al. |
| 2012/0278781 | A1 | 11/2012 | Wann et al. |
| 2014/0040838 | A1 | 2/2014 | Liu et al. |
| 2015/0278429 | A1 | 10/2015 | Chang |
| 2018/0342494 | A1 | 11/2018 | Aton et al. |
| 2021/0126014 | A1* | 4/2021 | Kim ............... H01L 27/0207 |
| 2022/0058327 | A1* | 2/2022 | Yang ............... G06F 30/392 |

* cited by examiner

*Primary Examiner* — Paul Dinh
(74) *Attorney, Agent, or Firm* — Hauptman Ham, LLP

(57) ABSTRACT

A device includes a first cell active area asymmetrically positioned in a first device column between a first barrier line and a second barrier line, a second cell active area asymmetrically positioned in a second device column between the first barrier line and a third barrier line, where the first cell has a first cell length in a first direction perpendicular to the first barrier line which is three times a second cell length in the first direction. The first cell active area and the second cell active area are a first distance from the first barrier line, and the first cell active area is a second distance from the second barrier line, and the second cell active area is the second distance away from the third barrier line.

20 Claims, 11 Drawing Sheets

INTEGRATED CIRCUIT WITH ASYMMETRIC MIRRORED LAYOUT ANALOG CELLS

CROSS-REFERENCE TO RELATED APPLICATIONS

This application is a divisional application of co-pending U.S. patent application Ser. No. 16/219,573, filed Dec. 13, 2018, which claims benefit of U.S. Provisional Patent Application Ser. No. 62/644,280 filed Mar. 16, 2018, which are both incorporated herein by reference in their entirety.

BACKGROUND

Integrated circuits contain one or more semiconductor devices. Integrated circuits are represented by plan view diagrams called layout diagrams, which contain information about the size, position, and orientation of elements of the semiconductor devices located therein. Integrated circuits are manufactured using cells, or groups of functional elements, that perform low level functions of the semiconductor device. Cells are standard or custom cells, according to a desired design of a semiconductor device and a desired manufacturing plan that balances semiconductor device size on a substrate, with cost associated with designing and manufacturing the integrated circuit.

Cells are organized into libraries according to size, function, or other aspects of the cell. Standard cells in a library are analog or digital. Standard cells have at least one dimension in common with other cells of the library, such as a standard length of the cells. Standard cells of a library facilitate layout of a semiconductor device and reduce the complexity of designing an integrated circuit by using pre-characterized standard cells, with known performance characteristics, and regular cell positions on the substrate of the integrated circuit. Layout of semiconductor devices with custom cells or non-standard cells with standard cells is also more complex than layout of semiconductor devices with only standard cells. Reduced complexity of semiconductor device design is a desirable outcome.

Custom cells, or non-standard cells, with dimensions that differ from the standard cell dimension, have an increased risk of defects or deviations from desired electrical performance parameters in the integrated circuit because of manufacturing errors. Structural defects and/or deviating performance parameters of an integrated circuit increase a manufacturing cost for said integrated circuits, and result in premature device failure, elevated power consumption, or irregular device performance. Decreased manufacturing defect levels is a desirable outcome of integrated circuit manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
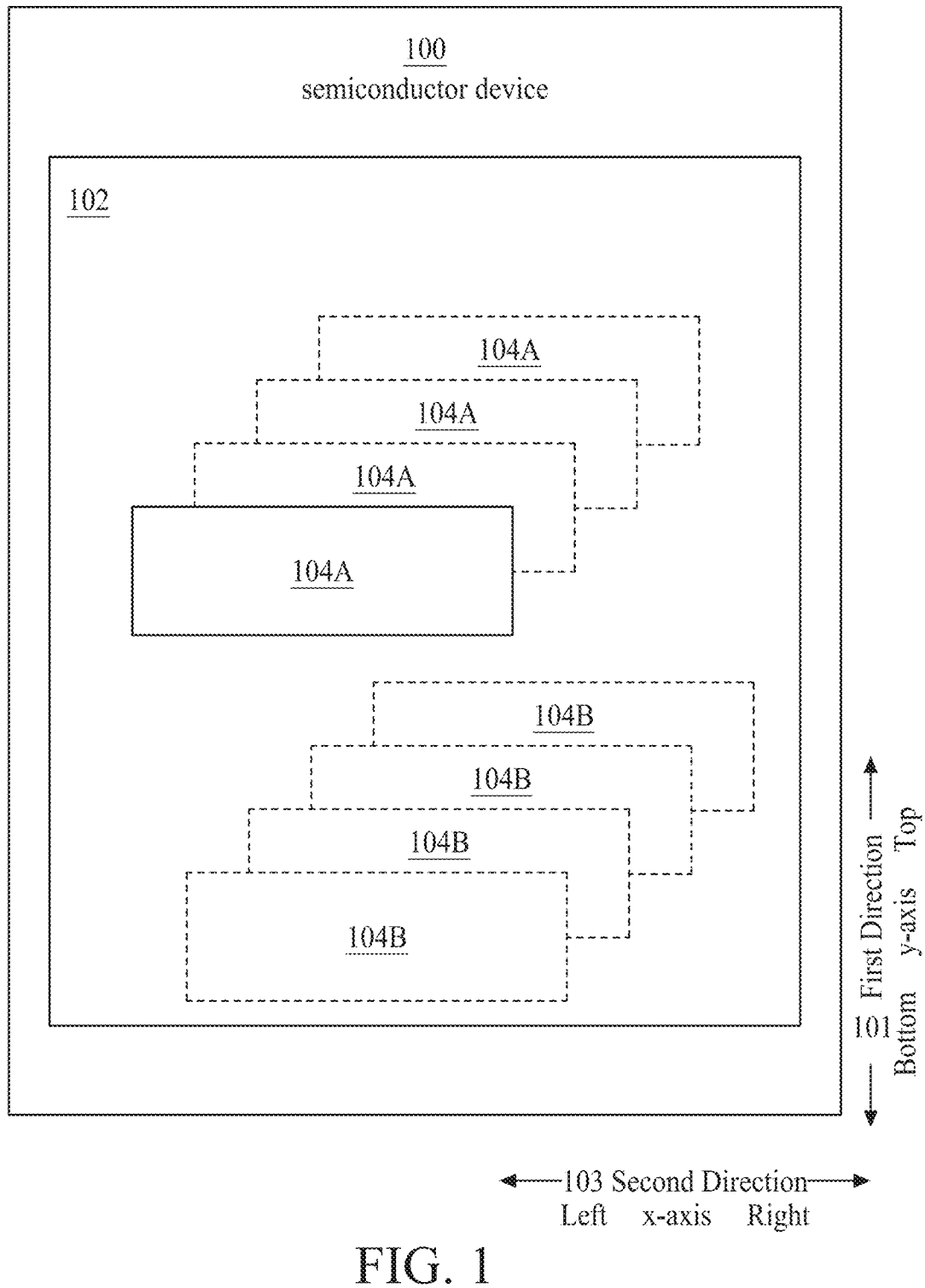
FIG. 1 is a block diagram of a semiconductor device in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, and the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" or the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit having individual cells arranged by columns includes cells that are vertically symmetric, and cells that are vertically asymmetric. Vertically symmetric cells have a same amount of separation between fins in the cell active area and cut poly lines (e.g., oxide insulating structures between active areas in an integrated circuit). Vertically asymmetric cells have a different amount of separation between fins of the cell active area and the top and bottom cut poly lines. Cells with vertical asymmetry have cut poly lines that align with cut poly lines in cells of other columns of the IC. Cells with vertical asymmetry have active area borders and/or edges that align, along the direction of the fins, with active area borders and/or edges of cells in other columns of the IC. Vertical asymmetry of some cells occurs in pairs of adjoining cells in a column of an IC: two cells having vertical asymmetry have mirrored layouts and spacings between the cell active areas and the cell cut poly lines.

FIG. 1 is a block diagram of a semiconductor device 100, in accordance with at least one embodiment of the present disclosure. In FIG. 1, semiconductor device 100 includes, among other things, a circuit macro (hereinafter, macro) 102. In some embodiments, macro 102 is a transistor macro. In some embodiments, macro 102 is a macro other than a transistor macro. Macro 102 includes, among other things, one or more standard-cell-adapted FinFET arrangements 104A. In some embodiments, macro 102 includes, among other things, one or more arrangements 104A and one or more arrangements 104B. In some embodiments where one or more arrangements 104A and one or more arrangements 104B are included, arrangement 104A differs from arrangement 104B. Examples of each of arrangement 104A and 104B include arrangements in semiconductor devices fabricated based on corresponding layout diagrams shown in each of FIGS. 3-6, or the like.

Integrated circuits include groups of circuit components that are configured to perform predetermined circuit functions. Examples of such integrated circuit (IC) functions include receiving signals, sending signals, communication between components of an IC and on other ICs, storing data, performing calculations, and managing IC functionality (memory controllers, IC timing circuit elements, and other similar functionality). Groups of circuit components may be pre-configured as standard cells that are arranged in an integrated circuit layout process prior to an integrated circuit manufacturing process. Standard cells facilitate simplified circuit performance simulation using the predetermined blocks, or standard cells, of the circuit design. Some embodiments of standard cell libraries include purely digital circuit components. Some embodiments of standard cell libraries include purely analog circuit components. Some standard cell libraries include mixtures of digital and analog circuit components configured to work together in a single integrated circuit.

Integrated circuit manufacturing involves using standard cells in cell libraries to simplify a design process for integrated circuits. In some embodiments, simplified design processes using standard cells in libraries limits a manufacturer's ability to maximize circuit component density of an integrated circuit. Standard cells have a standard cell length in a first direction and a standard cell width in a second direction (different from the first direction) so that cell borders of the standard cell align with the cell borders of other standard cells (the cell borders forming a regular grid, and the cell active areas being evenly distributed within the regular grid of standard cell borders), and so that cell components within standard cells have a standard separation or spacing from a cell border. In some embodiments, the second direction is perpendicular to the first direction. A standard cell size is desirable in integrated circuit design and manufacturing in order to simplify the abutment of adjacent cells in rows and columns of the integrated circuit. Standard size cells contain, within the area of the standard cell, a certain number of active fins or active lines that are used to form circuit elements. However, some circuit elements of an integrated circuit do not use the same number of fins as are present in the standard size cell (a "normal" number of fins) in order to function. Some circuit elements use a smaller number of fins (a "low" number of fins), and some circuit elements use a larger number of fins (a "high" number of fins). Such different size cells have different cell lengths in a first direction extending across, or perpendicular to, the direction in which the fins extend on a substrate. Abutting cells having different cell lengths present some difficulty with alignment (in a second direction, along the direction of the fins) of cell elements in other columns. In some embodiments, the cells for which alignment is desired are in adjoining columns. In some embodiments, the cells for which alignment is desired are in columns separated by another column. Integrated circuits with cells having different cell lengths sometimes align same types of cells into columns along the first direction (perpendicular to the fins) or rows (parallel with the fins). Cell element misalignment issues arise when the lengths of cells in one column are different from the lengths of cells in a different column, when cells have symmetric layouts along the first direction, as described below.

Cells in cell libraries have preconfigured layouts with predictable and consistent performance and known levels of interference with other parts of an integrated circuit. Integrated circuit design aims to reduce interference as much as possible, and to maintain performance of circuit elements within desired parameters. To preserve performance characteristics of the cells within anticipated ranges in completed circuits, a baseline separation distance exists between components of a cell and circuit elements of adjoining cells of the circuit. The baseline separation distance is an interior separation distance between a cell border and elements of the circuit within a circuit cell.

Vertically symmetric cells have a same distance between the cell active area and the top and bottom edges of the cell. In some embodiments, a vertically symmetric cell has one separation distance between the cell active area and a cell border shared with a cell within the column (e.g., the top and bottom edges of the cell), and a different separation distance between the cell active area and cell borders of adjacent columns. In some embodiments, a vertically symmetric cell has a single separation distance between the cell active area and all cell borders.

Vertical symmetry of a cell is independent of cell length. In some embodiments, vertically symmetric cells having a same cell length have different separation distances between cell active areas and top and borders of the cells. Vertically symmetric cells having different cell lengths generally have different active area lengths, and different vertical separation distances between active areas and top and bottom edges of cells in a column of cells. Manufacturers use standard cell lengths whenever possible to reduce, as much as possible, interference or coupling of cell elements in active areas of cells, and to simplify layout of cells in an integrated circuit.

When cells are formed in an integrated circuit, a plurality of lines are etched into a semiconductor substrate in preparation for cell formation. In some embodiments, the semiconductor substrate is a silicon substrate, although other substrates are included within the scope of the present disclosure. The substrate may be one of an elementary semiconductor material, a compound semiconductor material, and/or an alloy semiconductor material. Examples of elementary semiconductor materials include, but are not limited to, monocrystalline silicon (Si), polycrystalline silicon (poly-Si), amorphous silicon (a-Si), germanium (Ge), and/or diamond (C). Examples of binary compound semiconductor materials include, but are not limited to, Iv-Iv materials including silicon germanium (SiGe), germanium carbide (GeC), and silicon carbide (SiC), and III-v materials including gallium arsenide (GaAs), gallium phosphide (GaP), indium phosphide (InP), indium arsenide (InAs), and/or indium antimonide (InSb). Examples of tertiary and quaternary compound semiconductor materials include, but are not limited to, GaAsP, AlInAs, AlGaAs, GaInAs, GaInP, and/or GaInAsP. Within the present disclosure, lines of a semiconducting substrate shall be referred to as poly lines for simplicity and clarity, although other materials than polysilicon are contemplated.

During a manufacturing process, cell borders are formed by etching some lines away, leaving rows of active lines in active areas of the cells between the etched regions. Adjacent active areas of an integrated circuit are separated from each other by isolation structures that reduce cross-talk or inadvertent signal transfer between active areas. Some isolation structures include dielectric structures formed by depositing dielectric material into the spaces formed after removal of dummy or inactive lines. Dielectric material thus deposited electrically isolates poly lines in different cells from each other, and electrically isolates poly lines within a same cell from each other. Some isolation structures include cut poly lines, or breaks in the continuous lines that extend across a substrate. Some cut poly lines are used to etch the poly lines to form spaces or breaks that extend in a direction perpendicular to the run direction of the lines of the active areas. Some cut poly lines are used to etch one or more long segments of an undoped poly line located at a border between adjoining active areas of an integrated circuit.

Some isolation structures include barrier lines, or poly lines that are between active areas of an integrated circuit. A barrier line is an undoped poly line, similar to the doped poly lines of a gate structure that physically separates doped poly lines in one active area from doped poly lines of the adjoining active area. A barrier line extends in parallel to doped poly lines of an integrated circuit that form part of active areas of the integrated circuit. A barrier line has a center that extends down the middle of the barrier line, parallel to the edge of the barrier line, and parallel to the centers of doped poly lines in the active areas of the integrated circuit that adjoin the barrier line. The separation distance between an active area and a barrier line at a cell border of the active area is determined using Equation 1, below, by multiplying the fin pitch by an integer representing a number of fins, and adding a width corresponding to half the width of a single fin:

$$SD = n \times p - \frac{w}{2}$$ Equation (1)

where SD=separation distance, p=fin pitch, w=fin width, and n=1, 2, 3 . . . (a number of fins originally present between the edge of the active area and the cell edge).

As discussed herein, the term "second direction" refers to a direction aligning with a longitudinal axis of barrier lines and fins of an active area, and the term "first direction," corresponds to a direction perpendicular to the second direction, across the barrier lines or fins of active lines of the integrated circuit. Cells are arranged in columns that extend along the first direction and adjoin each other in the second direction. Column borders also extend along the first direction. A barrier line extends in the second direction. A cut poly line is a like demarking the break in a silicon material of a barrier line (an undoped poly line) or a doped poly line of an active area of the integrated circuit. Barrier lines correspond to cell borders that extend in the second direction. Thus, the terms "top" and "bottom" refer to positions along the first direction, and the terms "left" and "right" refer to positions along the second direction, with respect to a center of an active area of the integrated circuit. The term "vertical" refers to orientations with respect to the first direction, and the terms "lateral" or "horizontal" refer to orientations with respect to the second direction. Cell length and active area length are measured along the first direction, and cell width is measured along the second direction. An active area of a cell is vertically situated between the top and bottom barrier lines of a cell. Adjacent cells, whether in the first direction or in the second direction, share a cell border. A barrier line between two adjacent active areas has a centerline that corresponds to the shared cell border of the two adjacent active areas. A cut poly line has a centerline corresponding to the center of the gap between the truncated poly lines of active areas that adjoin each other along the second direction. A centerline of a cut poly line corresponds to a shared cell border of the two adjacent active areas.

The present disclosure relates to asymmetric cells in an array of cells, where a first asymmetric cell is arranged vertically with another asymmetric cell having a layout that mirrors, across a shared cell boundary, the layout of the first asymmetric cell. Mirrored, or flipped, cells form mirrored pairs of cells. Separation distances in mirrored pairs of vertically asymmetric cells arranged in columns are adjusted to align edges of active areas in the mirrored pair of cells, with edges of active areas in laterally adjacent columns, to improve alignment of cell elements. By improving alignment of cell active areas in laterally adjacent columns, manufacture of integrated circuits is simplified, yield of integrated circuits increases, and/or performance specifications of integrated circuits are closer to desired specifications. A clarifying presentation of how strict adherence to cell symmetry in laterally adjoining cells of an integrated circuit, where the laterally adjoining cells have different cell lengths, is given below, to show how lateral misalignment of cell element occurs.

Figure 2:
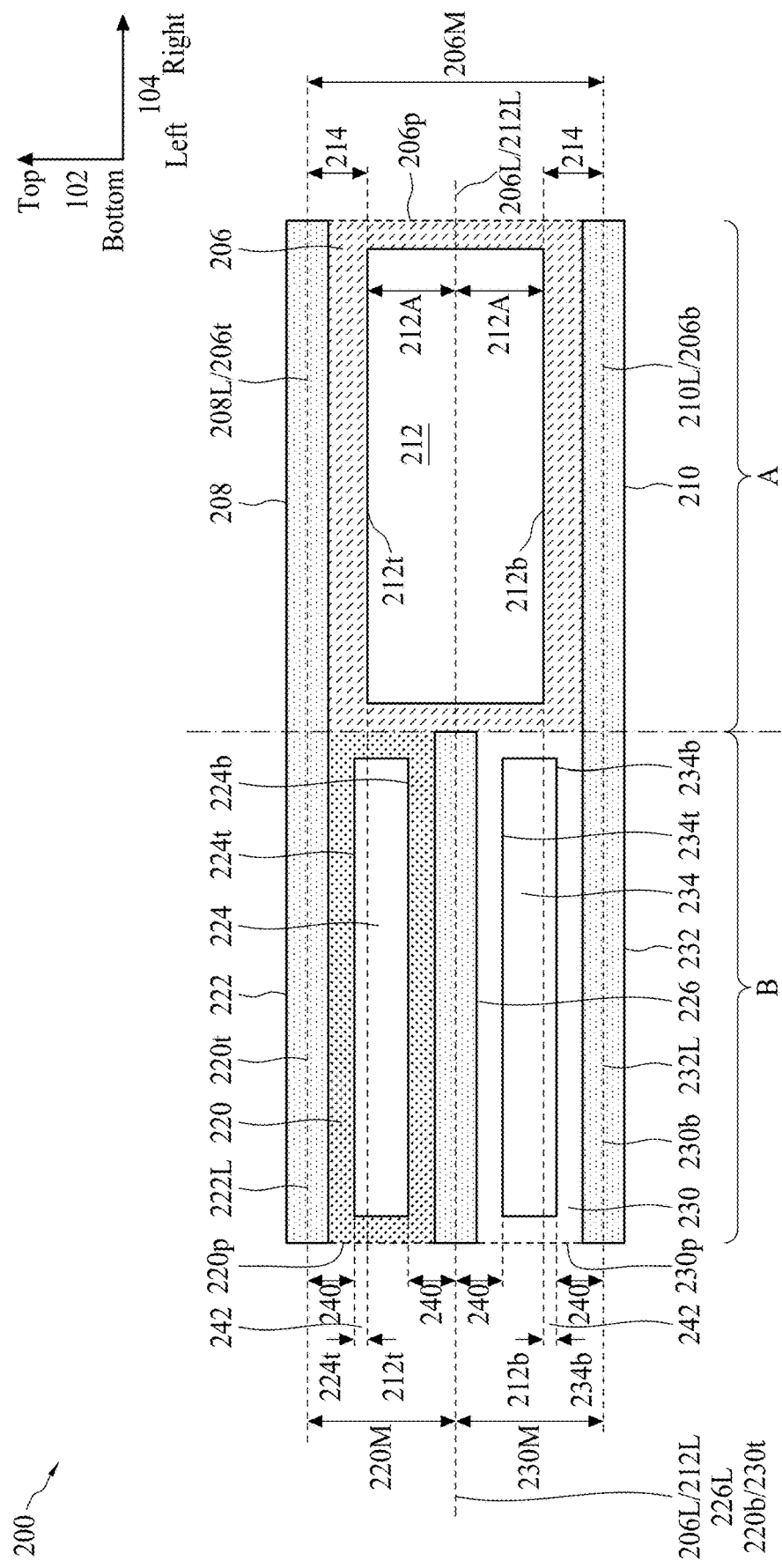
FIG. 2 is a plan view of adjacent symmetric cells of an integrated circuit, according to some embodiments.

FIG. 2 is a plan view of an integrated circuit 200 having symmetric standard cells with cell lengths measured in a first direction 101 and cell widths measured in a second direction 103. Integrated circuit 200 includes standard cell 206 in column A, having a first cell length 206M and a standard cell perimeter 206p. A top edge 206t of standard cell 206 corresponds to a centerline 208L of a first cut poly line 208. A bottom edge 206b of standard cell 206 corresponds to a centerline 210L of a second cut poly line 210. Standard cell 206 includes active area 212 having a top edge 212t and a bottom edge 212b parallel to each other and to top edge 206t and bottom edge 206b of standard cell 206. Top edge 206t and top edge 212t are separated by a first separation distance 214 (also known as a uniform separation distance or a common separation distance). Bottom edge 206b and bottom edge 212b are also separated by separation distance 214. Because separation distance 214 is between both the top edges 206t and 212t, and bottom edges 206b and 212b, standard cell 206 is vertically symmetric. Standard cell 206 has first cell length 206M measured from top edge 206t to bottom edge 206b. A centerline 206L is equidistant between top edge 212t and bottom edge 212b (see distance 212d), and between top edge 206t and bottom edge 206b (distance 212d+separation distance 214).

Integrated circuit 200 includes standard cells 220 and 230 in column B that adjoins column A. In column B, cut poly line 222 at a top of standard cell 220 corresponds to a same line as cut poly line 208 of column A, and cut poly line 232 at a bottom of standard cell 230 corresponds to a same cut poly line as cut poly line 210 in column A. In column B, standard cell 220 and standard cell 230 share cut poly line 226. A centerline 226L of cut poly line 226 extends through a center of standard cell 206 (e.g., centerline 206L), and a center of active area 212 within standard cell 206 (e.g., centerline 212L).

In standard cell 220, top edge 220t corresponds with centerline 222L of cut poly line 222, and the bottom edge 220b corresponds with centerline 226L of cut poly line 226. Centerline 226L also corresponds with the top edge 230t of standard cell 230 and with centerline 206L of symmetric cell 206. Standard cell 220 includes, between cut poly lines 222 and 226, an active area 224, with an active area top edge 224t and an active area bottom edge 224b, where active area top edge 224t is between active area bottom edge 224b and cut poly line 226. Standard cell 220 has a cell perimeter 220p, and a cell length 220M that is half the length of cell length 206L.

Standard cell 230 has a cell perimeter 230p, and a cell length 230M that is half the length of cell length 206L. The top edge 230t of standard cell 230 corresponds with the centerline 226L of cut poly line 226, and with the centerline 206L of standard cell 206. The bottom edge 230b of standard cell 230 corresponds with a centerline 232L of cut poly line 232. Standard cell 230 contains a second active area 234 with a top edge 234t and a bottom edge 234b, where top edge 234t is between bottom edge 234b and cut poly line 226.

Standard cells 220 and 230 have the same layout: active area 224 is centrally located within standard cell 220 between cut poly lines 222 and 226, and where active area 234 is centrally located within standard cell 230 between cut poly lines 226 and 232. Thus, a separation distance in the first direction between an edge of either of symmetric cells 220 or 230 and the centerline of the nearest cut poly line at the top of the column, the bottom of the column, or at the center of the column, is the same distance. Thus, each of: the centerline 222L and top edge 224t, the centerline 226L and bottom edge 224b, the centerline 226L and top edge 234t, and centerline 232L and bottom edge 234b, are separated by separation distance 240. Because both of symmetric cells 220 and 230 are symmetric, the cells mirror each other across the centerline 226L.

Standard cells 220 and 230 are individually vertically symmetric. The active area of each cell is located at the center of the cell, and a uniform separation distance between the active area and at least the top and bottom edges of the cell is preserved. However, because of adherence to this common design rule, the edges of active area 212 in standard cell 206 are misaligned with edges 224t and 226b of standard cells 220 and 230. Top edge 212t of standard cell 206 is farther from shared centerline 208L/222L than top edge 224t (e.g., first separation distance 214 is larger than separation distance 240). Bottom edge 212b is farther from shared centerline 220L/232L than bottom edge 234b (first separation distance 214 is larger than separation distance 240). The difference between first separation distance 214 and separation distance 240 is the offset distance 242 between standard cell 206 and cells 220 and 230.

Active area offsets or edge misalignments in IC designs, as shown in FIG. 2, lead to device performance issues or manufacturing problems because of difficulties with pattern transfer from a patterning template to the integrated circuit. Patterning templates include photolithography masks or reticles for transferring pattern information to layers coated on a substrate of an integrated circuit. Active area offsets or edge misalignments are, in some embodiments of integrated circuits or methods of making integrated circuits, smaller than a wavelength of light. Methods of making pattern transfer templates, including photolithography masks, are prone to preserving alignment of adjoining features on the transfer template, at the expense of preserving specified dimensions of the adjoining features according to the planned integrated circuit layout. Misalignment of cell elements in the second direction results in an increased risk of defects during a manufacturing process. Masking and pattern transfer issues result in poly lines or other cell features that are too narrow or too wide in the first direction. In some instances, such misalignment/dimensional deviation results in line tipping, enhanced breakage, excessive switching times, long gate lengths, and so forth.

Figure 3A:
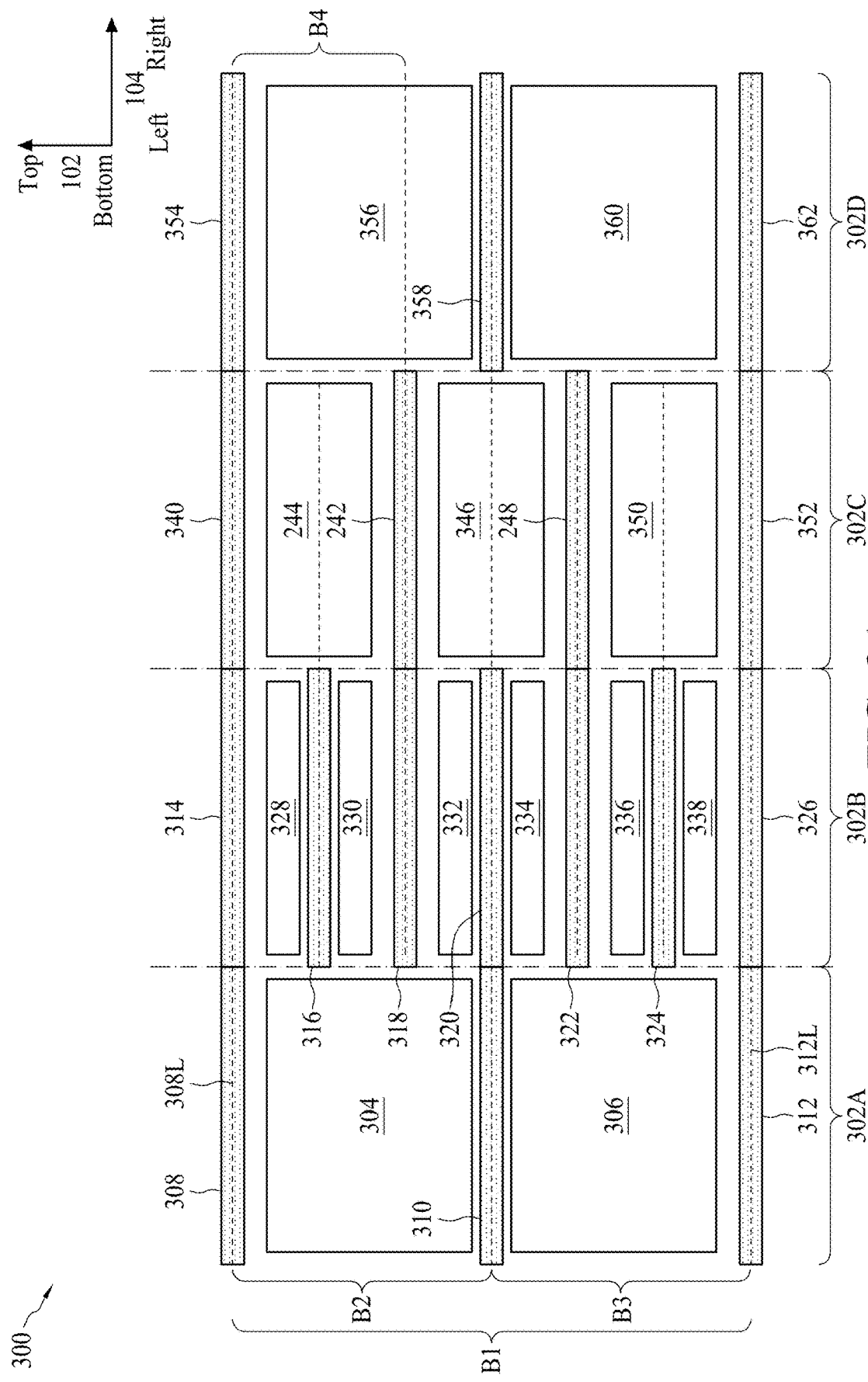
FIGS. 3A-3B are plan views of cells in an integrated circuit, according to some embodiments.

In some embodiments, such as shown in FIG. 3A, integrated circuits include standard cells of different sizes. Arrays of standard cells include standard analog cells, also called "full size" or "standard" cells, which have a standard length in a first direction and a standard width in a second direction. The first direction and the second direction should be interpreted herein as shown in FIG. 3A. Some standard cell libraries, and integrated circuits based thereon, include cells with cell lengths that are integer multiples of the standard cell length. Some standard cell libraries, and integrated circuits based thereon, include cells with cell lengths that are non-integer multiples of the standard length L of the cell library. A cell length is measured in the first direction 101. In some embodiments, a standard cell of the cell library has standard length L, and other cells in the library have a cell length L2, where L2=0.5L, and/or, a length L3, where L3=1.5L. Although non-integer multiples of the standard cell length (e.g., L2=0.5L, and L3=1.5L), other non-integer multiples of the standard cell length are also envisioned for cells in the standard library falling within the scope of the present disclosure. In some embodiments of standard cells, and integrated circuits based thereon, some cells have cell lengths that are integer multiples of the standard length. Layout of such "integer-multiple" standard cells is simpler than layout of "non-integer multiple" cell length cells, because "integer-multiple" cells preserve, among them, a same separation distance as found in standard cells of the library because the top and bottom edges of cells align smoothly with the traditional gridded layout of standard cells in an integrated circuit. A ratio of the length of a standard cell and a non-standard cell does not need to correspond to the ratio of the lengths of the active areas in standard and non-standard cells that adjoin each other in the second direction. Other non-integer multiple cell length standard cells (e.g., 2.5, 3.5, and so forth) are also envisioned within the scope of the present disclosure.

FIG. 3A is a plan view of an array of analog cells in an integrated circuit 300, according to some embodiments. In FIG. 3A, a plurality of standard cells are arranged according to some embodiments of the present disclosure. Some standard cells in integrated circuit 300 are symmetric, and some are singly asymmetric, but arranged in pairs to have mirroring symmetry or flipped symmetry with each other and have lateral alignment of cell elements with cells in different columns. Cells of integrated circuit 300 have a cell width 301 in the second direction. In some embodiments, cells of the integrated circuit all have the same cell width. In some embodiments, cells of the integrated circuit have different widths in different columns. In some embodiments, some columns of cells share a common cell width with cells of another column, and the two columns adjoin each other. In some embodiments, some columns of cells share a common cell width with cells of another column, and the two columns are separated from each other by a column with cells having a different cell width. Cells of integrated circuit 300 are arranged into four columns, as follows. A first column 302A, has two cells: analog cell 304 with active area 304A, and analog cell 306 with active area 306A. Cells 304 and 306 in first column 302A are bounded by topmost cut poly line (or barrier line) 308 at a top of the column in the first direction 101, a second barrier line (or center barrier line) 310, and a bottom-most barrier line 312. The cells shown in the first column 302A are vertically asymmetric cells (individually), but the pair exhibits mirroring symmetry (or, flipped symmetry) centered on central barrier line 310.

Mirroring symmetry of pairs of cells in a column of standard cells results in each of the top and bottom cells in a mirrored pair of cells has a same cell length, a same size active area, and a shared barrier line (the central barrier line of the mirrored pair of cells) about which the symmetry focuses. In a mirrored pair of cells, the separation distance between the mirrored cell boundary (the centerline of the shared central barrier line) and the closest edge of an active area of a cell in the mirrored pair (also called the inner separation distance) is the same as in each cell. Similarly, the separation distance between the edge of a cell's active area and the boundary opposite the mirrored cell boundary (also known as the outer separation distance) is the same in each other cell, and is different from the inner separation distance.

Cells in integrated circuit 300 are divided into cell blocks. In column 302A, cell 304 and cell 306 are symmetric around center barrier line 310 and comprise a first cell block B1. As described hereafter, other cells in the array are divided into cell blocks, such as blocks B2, B3, and B4. A block includes a single cell, a pair of cells that are vertically symmetric (such as cells 304 and 306), or multiple pairs of cells that are vertically symmetric (such as cells 328, 330, 332, 334, 336, and 338). Block B4 has a block length equal to the standard length of a cell. Blocks B2 and B3 have a block length equal to 1.5 times the standard length of a cell. Block B1 has a block length equal to 3 times the length of the standard length. Cell blocks typically have a block length that is an integer multiple (1×, 2×, 3×, and so forth) of the standard cell length of the array of analog cells, or a non-integer multiple (0.5×, 1.5×, and so forth) of the standard cell length. A block length of a mirrored pair of cells correlates with the symmetry pattern of separation distances in the mirrored pair of cells, and cells in a different column, as is described below.

In a symmetric cell, the terms "top" and "bottom," when referring to elements of the cell, refer to the elements on opposite sides of the centerline of the cell, where the elements are separated along the first direction. In pairs of cells, the terms "top" and "bottom" retain the same orientation as for symmetric cells with regard to the first and second directions as described in FIG. 3A. The terms "topmost" and "bottommost" refer to elements of the pair of cells that are at a greatest distance from each other in the first direction. For example, in column 302A, the pair of cells includes cells 304 and 306, and barrier line 308 is a topmost barrier line, barrier line 312 is a bottommost barrier line, and barrier line 310 is the center barrier line of the mirrored pair of cells. In discussions of groups of cells that span multiple columns, the terms "topmost" and "bottommost" generally retain the meaning reserved for pairs or groups of cells that are in a single column, i.e., cell elements at a greatest distance from each other. "Topmost" and "bottommost" may also be used in reference to cell elements within a repeating block, or mirrored pair of cells, when multiple mirrored pairs in a first column vertically adjoin each other within the length of a single cell, or a single mirrored pair of cells with a different cell length, in a second column. (See, e.g. cells in column 302A and 302B, where standard cells 328 and 338 are topmost and bottommost cells in the column, and cut poly lines 314 and 336 are topmost and bottommost barrier line segments shared with cells 304 and 306 in column 302A, but, within the topmost mirrored pair of cells in column 302b, comprising cells 328 and 330, the topmost and bottommost barrier lines are cut poly lines 314 and 318.

Integrated circuit 300 includes a second column 302B, which includes three mirrored pairs of vertically asymmetric cells: a first mirrored pair of cells includes cells 328 and 330, a second mirrored pair of cells includes cells 332 and 334, and a third mirrored pair of cells includes cells 336 and 338. The first mirrored pair of cells includes top barrier line 214, central barrier line 316, and a bottom barrier line 318. Second mirror pair of cells includes top barrier line 318, central barrier line 320, and bottom barrier line 322. Third mirrored pair of cells includes top barrier line 322, central barrier line 324, and bottom barrier line 326. Whether a barrier line is labeled as "top" or "central" or "bottom" depends on the position of the active areas of the pair of cells in a mirrored pair of cells. Thus, while a line is a top barrier line in one mirrored pair of cells, the same line is a bottom barrier line in a mirrored pair of cells that is above the first mirrored pair of cells, or further along the first direction from the first mirrored pair of cells. For example, barrier line 318 is the bottom barrier line for cell 230, and the top barrier line for cell 332, the bottommost barrier line for first mirrored pair of cells 328/330, and the topmost barrier line for mirrored pair of cells 332/334. Such convention for referring to barrier lines is followed throughout the present disclosure. For first mirrored pair of cells 328/330, the central barrier line 316 adjoins inner separation distances that are smaller than outer separation distances between the active areas of the cells and outer barrier lines 314/318. Similarly, for second mirrored pair of cells 332/334, inner separation distances proximal to central barrier line 320 are smaller than outer separation distances between the active areas of the cells and outer barrier lines 318/322, and, for third mirrored pair of cells 336/340, inner separation distances proximal to central barrier line 324 are smaller than outer separation distances between the active areas of the cells and outer barrier lines 322/326.

Integrated circuit 300 contains a third column 302C having three symmetric standard cells 344, 346, and 350. Cell 344 has top barrier line 340 and bottom barrier line 342, cell 346 has top barrier line 342 and bottom barrier line 348, and cell 350 has top barrier line 348 and bottom barrier line 352. Bottom barrier line 352 is a same cut poly line as barrier line 326 and barrier line 312 of columns 302B and 302A. Top barrier line 340 is the same cut poly line as barrier line 314 of column 302B and barrier lines 308 of column 302A. The separation distance in the first direction between each active area of cells 344, 346, and 350 and each cut poly line at a top edge or a bottom edge of the cells is the same separation distance, or the uniform separation distance (of a symmetric standard cell).

Cell 344 is the simplest block of integrated circuit 300 shown herein, a single cell having the standard cell length, equal to block length B4, in the first direction, wherein the active area is symmetrically positioned between top and bottom barrier lines/edges of the cell in the first direction. Vertically asymmetric cells 328 and 330 in column 302B are a mirrored pair of cells, comprising a second block of cells having the block length B4. Each of asymmetric cells 328 and 330 (also called the first mirrored pair of cells, as described above) has a cell length that is half of the standard length, and half of the block length B4. According to some embodiments, cell blocks comprise mirrored pairs of cells having a shared central barrier line or mirrored cell boundary, such as barrier line 316 between asymmetric cells 328 and 330. Accordingly, the second mirrored pair of cells 332/334 is a block of cells with a central barrier line 320 and block length B4, and the third mirrored pair of cells 336/338 is another block of cells with central barrier line 324 and block length B4. For each block of cells, or for each mirrored pair of cells, in column 302b, the inner separation distance is different form the outer separation distance of the block or mirrored pair of cells.

Integrated circuit 300 contains a fourth column 302D having two vertically asymmetric cells 356 and 360, similar to the vertically asymmetric cells of the block of cells/mirrored pair of cells in column 302A, i.e., cell 304 and cell 306. Cell 356 has an active area positioned between top barrier line 354 and central barrier line 358, and cell 360 has an active area situated between top barrier line 358 and 362. Like mirrored pair of cells 304/306, the inner separation distance between central barrier line 358 and the active areas is different from the outer separation distance between the active areas and outer barrier lines 354 and 362.

Figure 3B:
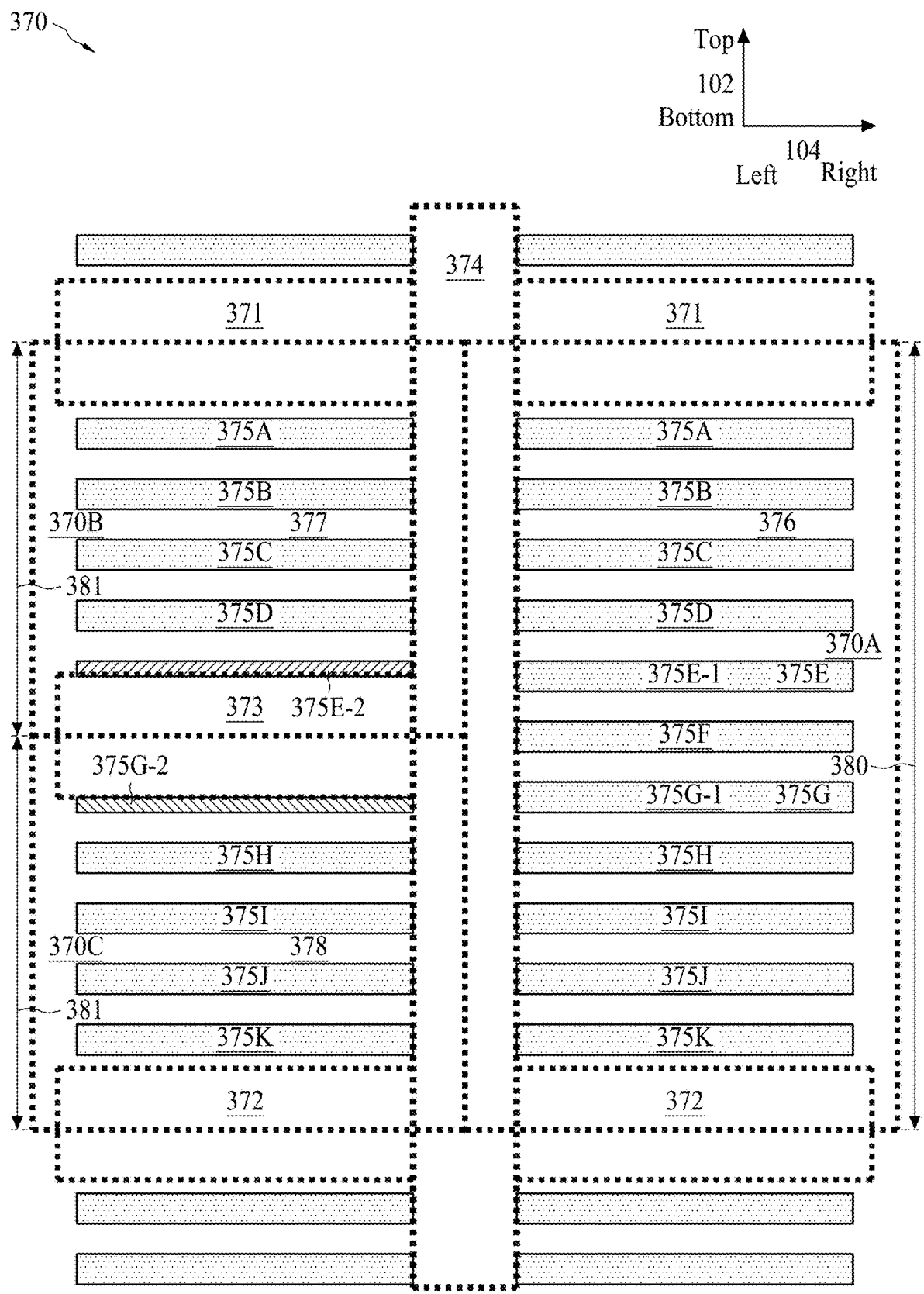

FIG. 3A is a plan view of a non-limiting embodiment of an integrated circuit having standard cells and cells with non-standard (shortened or elongated) cell lengths. In some instances, when making cells with non-standard cell lengths, barrier lines are trimmed during etch processes. Trimmed lines contribute to parasitic capacitance, power consumption, slower toggle times for a circuit element containing the cell, and/or device damage because trimmed lines are susceptible to tipping and breakage in manufacturing. Trimmed lines also interfere with the doping of non-trimmed lines in a cell, leading to a non-uniform distribution of switching times and/or leakage current through a cell. FIG. 3B is a plan view of a non-limiting representation of some embodiments of cells similar to those of FIG. 3A. FIG. 3B is a plan view of an array of cells 370 that includes three cells: cell 370A, having a standard cell length 380, and cells 370B and 370C, having a shortened cell length 381. Shortened cell length is half of the standard cell length 380. Cell lengths are measured in a first direction 101. Cell 370A has a top barrier line 371 that is a shared top barrier line with cell 370B. Cell 370A has a bottom barrier line 371 that is a shared bottom barrier line with cell 370C. Cells 370B and 370C are separated by a central barrier line 373. Cell 370A is separated from cells 370B and 370C by barrier line 374. Barrier line 374 separates columns of cells in the array of cells 370.

Lines 375A-375K extend along second direction 103. Lines are formed by etching a plurality of fins into a substrate, such as a semiconductor substrate, as described herein. Active areas are formed from a plurality of fins by forming isolation structures between the active areas. In some embodiments, a dielectric barrier is formed by etching an opening to a depth in the substrate that is greater than the depth of the fins in the substrate, and filling the opening with dielectric material, as with some trench isolation techniques. Cell 370A has an active area 376 between barrier lines 371 and 372 that includes segments of lines 375A-375K. Each line segment of active area 376 is an original fin width, with no trimming. The active area 376 is symmetrically positioned between barrier lines 371 and 372.

Cell 370B has an active area 377 that includes segments of lines 375A through 375E. Active area 377 is symmetrically positioned between barrier lines 371 and 373. The segments of lines 375A-375D in active area 377 are original-width fins, while line segment 375E-2 is a trimmed line segment. Line segment 375E-1 in active area 376 is an original-width fin. Cell 370C includes active area 378 with segments of lines 375G-375L. Active area 378 is symmetrically positioned between barrier lines 373 and 372. The segments of lines 375H-375K are original-width fins, while line segment 375G-2 is a trimmed line segment. As with line segment 375E-1, line segment 375G-1 in active area 376 is an original-width fin. Active areas 377 and 378 are converted into vertically asymmetric active areas in cells 370B and 370C by modifying a width, in the first direction, of barrier line 373 to eliminate the trimmed line segments 375E-2 and 375G-2. Thus, the original-width fins at the top and bottom edges of active areas 377 and 387 have, in cells where trimmed line segments are eliminated, more uniform doping characteristics and electrical properties than in cells where trimmed line segments remain.

Figure 4:
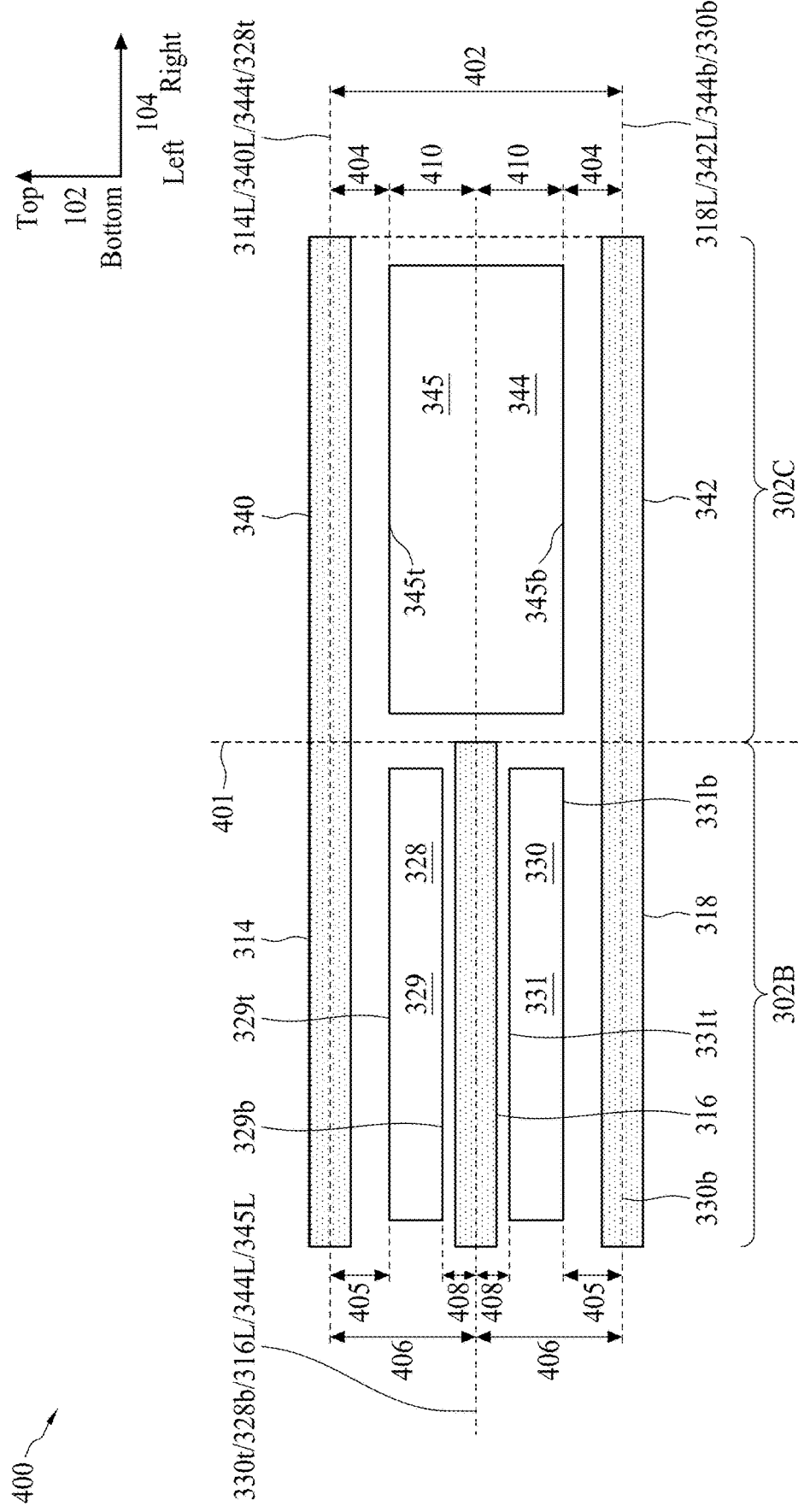
FIG. 4 is a plan view of a block of cells in an integrated circuit, according to some embodiments.
Figure 5:
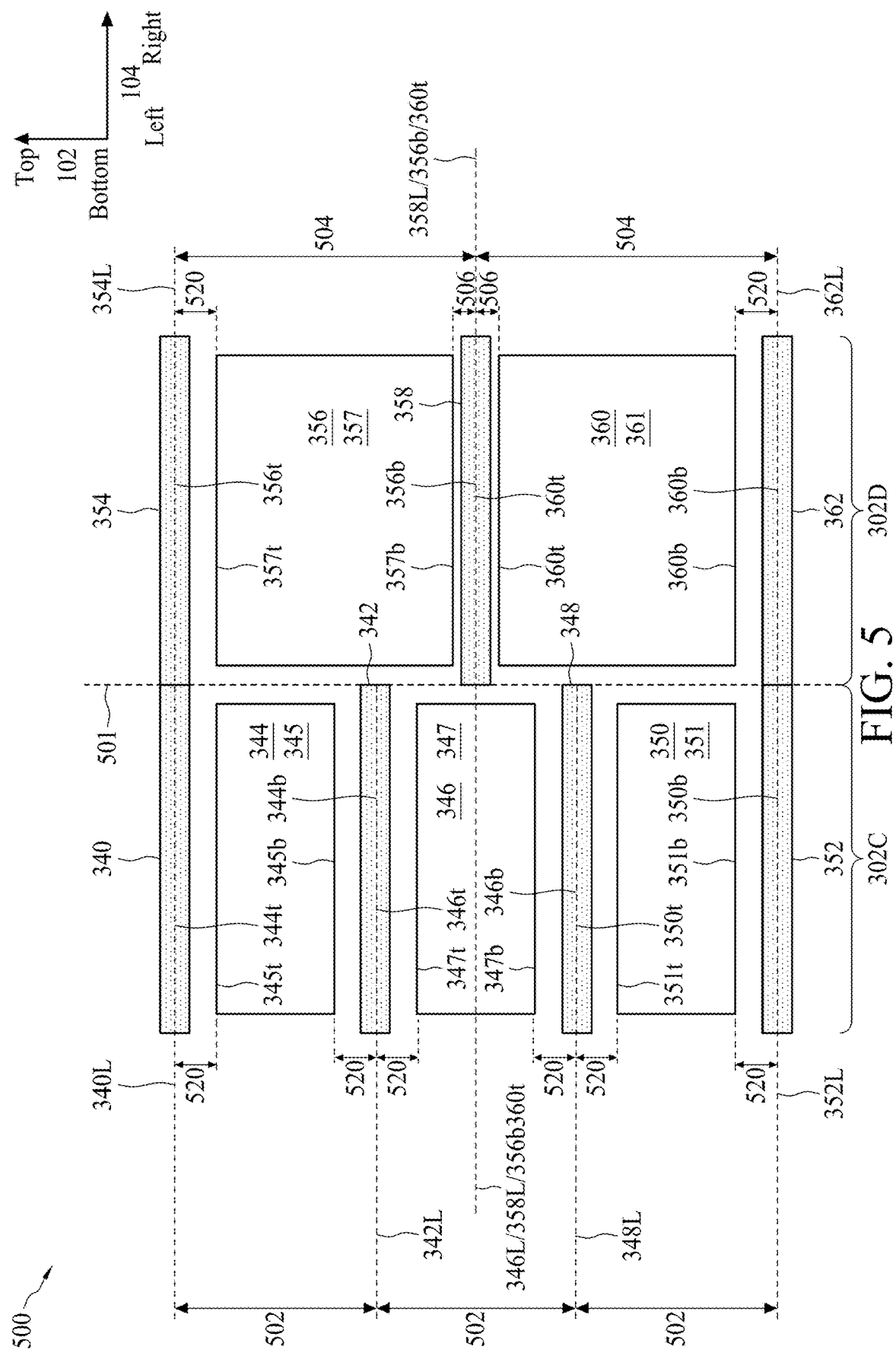
FIG. 5 is a plan view of a block of symmetric and vertically asymmetric cells in an integrated circuit, according to some embodiments.
Figure 6:
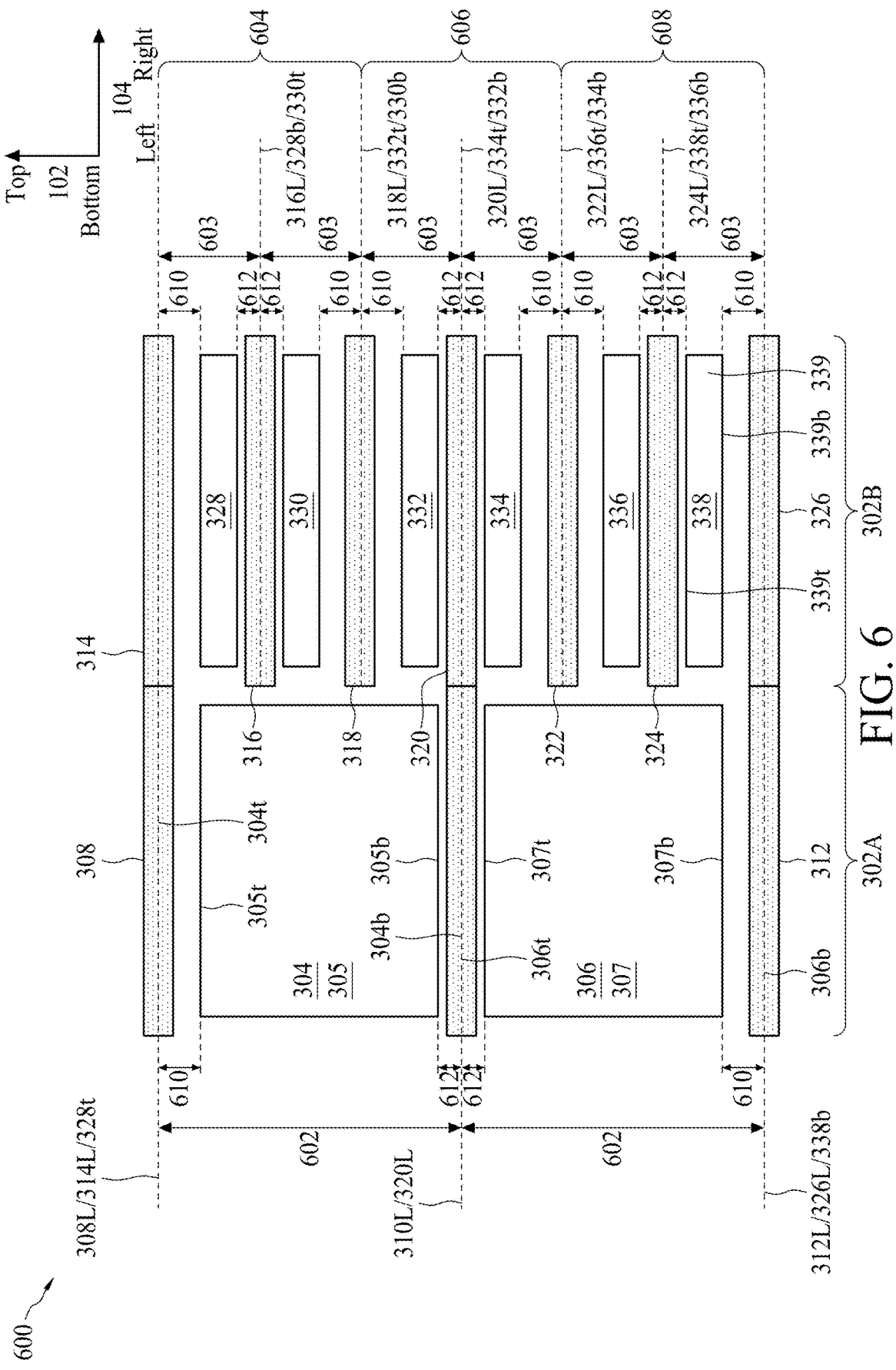
FIG. 6 is a plan view of a block of asymmetric cells in an integrated circuit, according to some embodiments.

FIGS. 4-6 are plan views of details of integrated circuit 300 to highlight aspects of the present disclosure. Integrated circuit 300 is a non-limiting embodiment of the subject matter of the current disclosure, and other embodiments, including different arrangements of symmetric and vertically asymmetric cells, are contemplated within the scope of the present disclosure. The elements portrayed in integrated circuit 300 are merely demonstrative as to the relationships between cells in integrated circuits, and not intended to exclude other configurations or layouts that also conform to the description provided herein. FIGS. 4-6 clarify some arrangements cells in integrated circuit 300, including vertically symmetric cells and/or vertically asymmetric (i.e., mirrored pairs) of cells within integrated circuit 300. The arrangements shown in FIGS. 4-6 clarify details of alignment of active areas of cells with different cell lengths, and separation distances between active areas and barrier lines of the integrated circuit.

FIG. 4 is a plan view of a block 400 of cells in integrated circuit 300, according to some embodiments. The block of cells includes asymmetric cells 328 and 330, in column 302B, and symmetric cell 344, in column 302C, as depicted in FIG. 3A, above. As described above, cells 328 and 330 are vertically asymmetric cells. In vertically symmetric cells 328 and 330, active areas are not evenly spaced between top and bottom barrier lines of the cells. Rather, cells 328 and 330 are a mirrored pair of cells sharing a mirrored cell boundary 316L. Active areas of cells 328 and 330 are vertically offset within the cell areas to be closer to central barrier line 316 than to top barrier line 314 (for cell 328), or bottom barrier line 318 (for cell 330).

Cell 344 in column 302C is a symmetric cell having a cell length 402. Symmetric cell 344 has a top edge 344t, a bottom edge 344b, and a cell centerline 344L along the second direction 103. Symmetric cell 344 has an active area 345 with an active area centerline 345L that corresponds to cell centerline 344L. Active area 345 has an active area top edge 345t, and an active area bottom edge 345b. Symmetric cell 344 has a top barrier line 340 (with a top barrier line centerline 340L), a bottom barrier line 342 (with a bottom barrier centerline 342L). Cell 344 has a first separation distance 404 between cell top edge 344t (which corresponds with cell top barrier centerline 340L) and active area top edge 345t, and the first separation distance 404 between cell bottom edge 344b (which corresponds with cell bottom barrier centerline 342L) and active area bottom edge 345b.

In column 302B, cell 328 has a top barrier line 314 (with a top barrier centerline 314L, which corresponds to top barrier centerline 340L of symmetric cell 344), a bottom barrier line corresponding to barrier line 316 (with a barrier centerline 316L, which corresponds to active area centerline 345L of symmetric cell 344), and a cell active area 329 with an active area top edge 329t and an active area bottom edge 329*b*. Barrier line 316 is a top barrier line for vertically asymmetric cell 330. Barrier line 316 has a barrier centerline 316L that corresponds to cell top edge 330*t*. Cell 330 has a bottom barrier line 318 (with a bottom barrier centerline 318L, which corresponds to cell bottom barrier centerline 342L of cell 344). Cell 330 also has a cell active area 331 with an active area top edge 331*t* and an active area bottom edge 331*b*. Vertically asymmetric cells 328 and 330 have a cell length 406, an outer separation distance 405, and an inner separation distance 408. Cell length is measured from a cell top edge to a cell bottom edge. Cell length 406 is half the length of cell length 402 of symmetric cell 344. For cell 328, outer separation distance 405 corresponds to a distance between active area top edge 329*t* and cell top edge 330*t*. For cell 330, outer separation distance 405 corresponds to a distance between active area bottom edge 331*b* and cell bottom edge 330*b*. Inner separation distance 408 corresponds to a distance between active area bottom edge 329*b* and cell bottom edge 328*b* (for cell 328), and to a distance between active area top edge 331*t* and cell top edge 330*t* (for cell 330). In vertically asymmetric cells, the inner separation distance and the outer separation distance are different distances. In some embodiments, the inner separation distance is larger than the outer separation distance. In some embodiments, the inner separation distance is smaller than the outer separation distance.

Cells in cell libraries have different cell lengths according to the number of fins (poly lines converted into active devices or circuit elements) within active areas of the cells. "Short" cells have a low number of fins or poly lines in active areas, while "long" or large cells have large numbers of fins or poly lines in active areas thereof, as compared to the number of fins in a standard-length cell. In positioning short cells next to standard or long cells across column boundaries (such as FIG. 4, column boundary 401) is that a centerline of a long, or a standard, cell corresponds to a centerline of a shared barrier line between two short cells. When the length of the short cell is an even fraction of the standard cell length (½, ¼, and so forth), a centerline of the standard cell active area aligns with the centerline of the shared barrier line, or the mirrored barrier line, between the shorter-cell length cells. (See, e.g., centerlines 316L and 344L in FIG. 4.) Vertically asymmetric cells such as cells 328 and 330 of FIG. 4 have vertically offset active areas to align active area edges in the vertically asymmetric cells with an active area top edge or an active area bottom edge in a symmetric cell in another column, is adjusted to modify inner separation distance 308 enough to align active area top edge 329*t* with active area top edge 345*t*, and active area edge 332*b* with active area bottom edge 345*b*. By aligning edges of active areas in each column (e.g., between column 302B and 302C), the lines that make up active areas in the vertically symmetric and the vertically asymmetric cells are not misaligned, and have improved device yield and device performance.

FIG. 5 is a plan view of a block 500 of symmetric and vertically asymmetric cells in integrated circuit 300, according to some embodiments. While FIG. 4 showed mirrored cell symmetry (also called flipped cell symmetry) with a standard cell (cell 344) and two "short" cells (cells having a cell length less than the standard cell length 402, FIG. 5 includes an arrangement of multiple standard cells (cells 344, 346, and 350) in column 302C, next to two "long" cells (having a cell length larger than the standard cell length), cells 356 and 360, while preserving alignment between topmost and bottommost active area edges in topmost and bottommost cells of each column.

Cells 344, 346, and 350 are symmetric standard cells of integrated circuit 300 located in column 302C. Top and bottom edges of active areas of each of cells 344, 346, and 350 are a first separation distance 520 from a cell border (the centerline of the barrier line above or below the active area to which the separation distance is being measured). Thus, separation distance 520 exists between active area top edge 345*t* and centerline 340L, active area top edge 347*t* and centerline 342L, active area top edge 351*t* and centerline 348L, and between active area bottom edge 345*b* and centerline 342L, active area bottom edge 347*b* and centerline 348L, and active area bottom edge 351*b* and centerline 352L. Cells 344, 346, and 350 have a cell length 502. Cell length is measured between (for cell 344) cell top edge 344*t* and cell bottom edge 344*b*, (for cell 346) cell top edge 346*t* and cell bottom edge 346*b*, and (for cell 350) cell top edge 350*t* and cell bottom edge 350*b*). In some embodiments, cell length 502 is the standard cell length 402. Each of cells 344, 346, and 350 have symmetric active areas between barrier lines of the cells.

Cells 356 and 360 have a cell length 504 that is greater than cell length 502. Cell length 504 is 1.5 times larger than cell length 502 because cell 344 and cell 356 share a top barrier line (340/354) and a top border, and because cells 350 and 360 share a bottom barrier line (352 and 362) and a bottom border. Cells 356 and 360 share a boundary line 358. Shared boundary line (or, mirrored boundary line) 358 is used to measure an inner separation distance 506 between centerline 358L and active area bottom edge 357*b* (for cell 356), and centerline 358L and active area top edge 361*t* (for cell 360). An outer separation distance between barrier line 354 and active area top edge 357*t* (for cell 356), and between barrier line 362 and active area bottom edge 361*b* (for cell 360) is different than inner separation distance 506. In some embodiments, the outer separation distance is larger than the inner separation distance. In some embodiments, the outer separation distance is smaller than the inner separation distance.

As described above with respect to FIG. 3B, active areas of cells that have a cell length that is different than the standard cell length have a risk of some lines in the active areas thereof being trimmed, leading to some narrow line segments at top or bottom ends of non-standard length cells. Trimmed lines contribute to parasitic capacitance, power consumption, slower toggle times for a circuit element containing the cell, and/or device damage because trimmed lines are susceptible to tipping and breakage in manufacturing. Trimmed lines also interfere with the doping of non-trimmed lines in a cell, leading to a non-uniform distribution of switching times and/or leakage current through a cell. By adjusting the size of an active area (e.g., in some embodiments, by modifying a width of a barrier lines or isolation structures to consume the trimmed portion during a barrier line formation step), the active areas become vertically asymmetric and have uniform-width fins, producing fins with more uniform performance characteristics. Removing fins that are trimmed from an integrated circuit by modifying a barrier line width (to include an area that would have been occupied by a trimmed fin), manufacturing defects are reduced and product yield increased.

FIG. 6 is a plan view of a block of asymmetric cells in an integrated circuit 300, according to some embodiments. Column 302A contains two cells: vertically asymmetric cells 304 and 306, as described above, with cell lengths 602 that are 1.5 times the standard cell length (see FIG. 4, element 306). Column 302B contains six vertically asymmetric cells, cells 328, 330, 332, 334, 346, and 338, each having a cell length 603 that is 0.5 times the standard cell length (see, e.g., FIG. 4, element 308). Vertically asymmetric cells 304 and 306 comprise a block 602 having a block length that is 3 times longer than the standard cell length, and cells 328, 330, 332, 334, 346, and 338 comprise three blocks 604, 606, and 608, which, combined have a length that is 3 times the standard cell length. Thus, centerlines 308L/314L for topmost barrier lines 308 and 314 correspond to top edges of cells 328 and 304, and centerlines 312L/326L of bottommost barrier lines 312 and 326. Although none of cells 304, 306, 328, and 338 are vertically symmetric cells, the cells have outer separation distances 610 that correspond to the standard separation distance of a symmetric standard cell (see, e.g., separation distance 304 of FIG. 3A, or separation distance 520 of FIG. 5). Accordingly, outer separation distances of each of blocks 604, 606, and 608 are the same distance 610, equal to the standard separation distance of a vertically symmetric cell in the integrated circuit 300. Further, inner separation distances of each or blocks 604, 606, and 608, of 302B, and of blocks 304 and 306 of column 302A, are the same distance 610 around mirrored cell boundaries of the mirrored pairs of cells 304 and 306 (line 310L), 320 and 330 (line 316L), 332 and 334 (line 320L), and 336 and 338 (line 324L). In some embodiments, inner separation distance 610 is larger than outer separation distance 610. In some embodiments, inner separation distance 610 is smaller than outer separation distance 610.

As described above with respect to FIG. 3B, active areas of cells that have a cell length that is different than the standard cell length have a risk of some lines in the active areas thereof being trimmed, leading to some narrow line segments at top or bottom ends of non-standard length cells. Trimmed lines contribute to parasitic capacitance, power consumption, slower toggle times for a circuit element containing the cell, and/or device damage because trimmed lines are susceptible to tipping and breakage in manufacturing. Trimmed lines also interfere with the doping of non-trimmed lines in a cell, leading to a non-uniform distribution of switching times and/or leakage current through a cell. By adjusting the size of an active area (e.g., in some embodiments, by modifying a width of a barrier lines or isolation structures to consume the trimmed portion during a barrier line formation step), the active areas become vertically asymmetric and have uniform-width fins, producing fins with more uniform performance characteristics. Removing fins that are trimmed from an integrated circuit by modifying a barrier line width (to include an area that would have been occupied by a trimmed fin), manufacturing defects are reduced and product yield increased.

Figure 7:
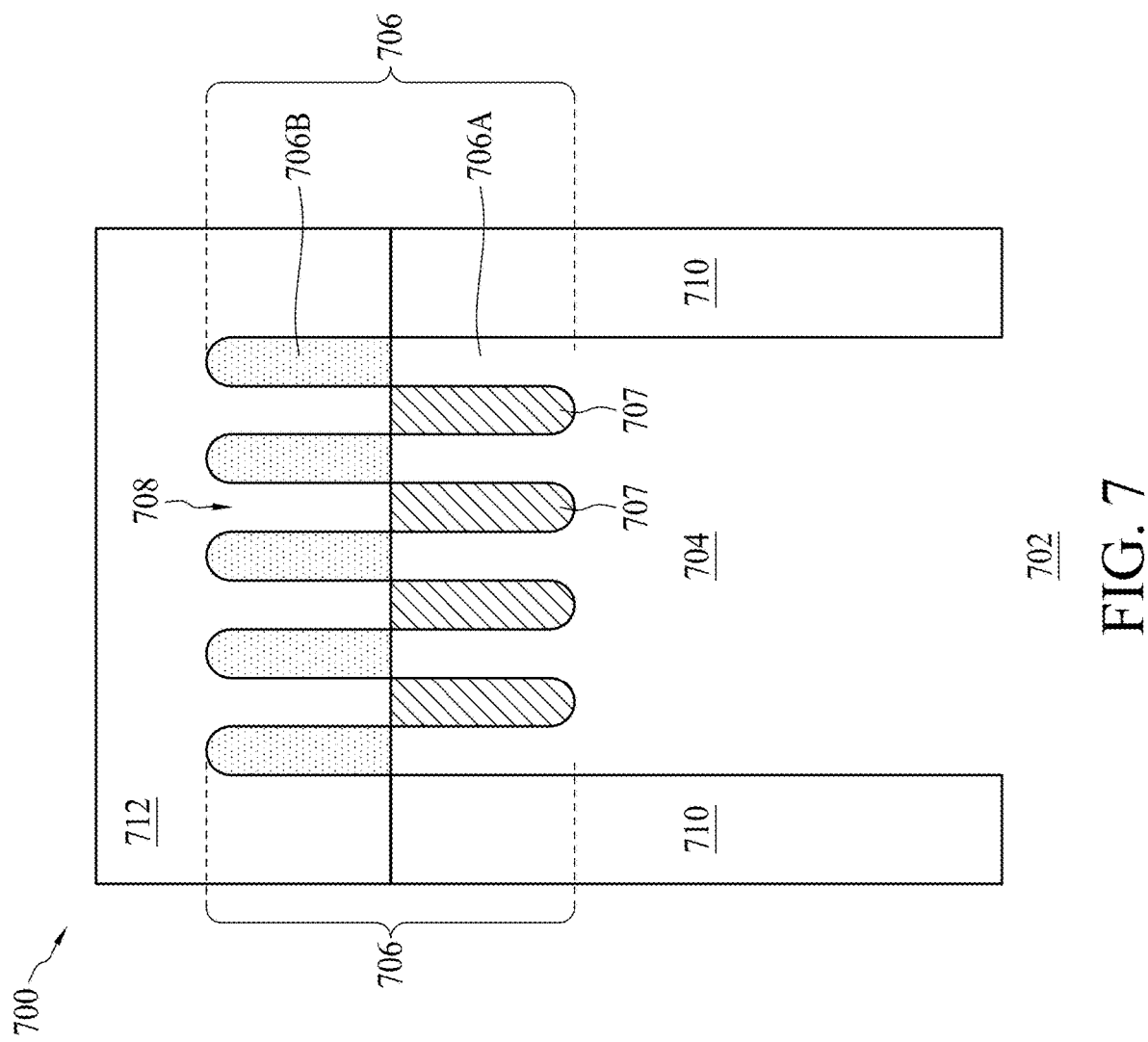
FIG. 7 is a cross-sectional diagram of a semiconductor device in an integrated circuit, according to some embodiments.
Figure 8:
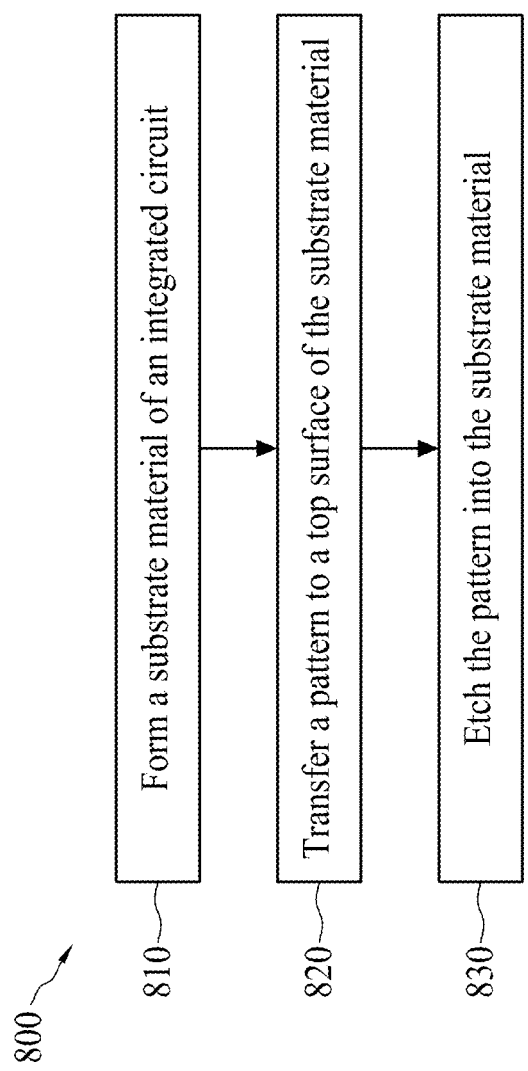
FIG. 8 is a flow diagram of a method of making integrated circuits, according to some embodiments.

FIG. 7 is a cross-sectional view of a semiconductor device 700 according to some embodiments of the present disclosure. A description of device 700 and the method 800 of making the device proceeds in parallel, below. FIG. 8 is a flow diagram of a method 800 of making an integrated circuit having vertically asymmetric cells having mirrored symmetry across a barrier line. The method 800 includes an operation 810, wherein a substrate layer 702 of an integrated circuit is formed. According to some embodiments, the layer of substrate material includes, but is not limited to: elementary semiconductor materials, compound semiconductor materials, and/or alloy semiconductor materials. Examples of elementary semiconductor materials include, but are not limited to, monocrystalline silicon (Si), polycrystalline silicon (poly-Si), amorphous silicon (a-Si), germanium (Ge), and/or diamond (C). Examples of binary compound semiconductor materials include, but are not limited to, IV-IV materials including silicon germanium (SiGe), germanium carbide (GeC), and silicon carbide (SiC), and III-V materials including gallium arsenide (GaAs), gallium phosphide (GaP), indium phosphide (InP), indium arsenide (InAs), and/or indium antimonide (InSb). Examples of tertiary and quaternary compound semiconductor materials include, but are not limited to, GaAsP, AlInAs, AlGaAs, GaInAs, GaInP, and/or GaInAsP.

In some embodiments, the semiconductor layer(s) incorporated in the substrate 702 are formed using a suitable technique or method including, but not limited to, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), atomic layer deposition (ALD), and/or combinations thereof.

In some embodiments, the substrate material includes both an insulating material and a semiconductor material to form a semiconductor-on-insulator (SOI) substrate. In some embodiments, SOI substrates include semiconductor layers formed on insulating material, such as silicon dioxide or sapphire. In some embodiments, the substrate includes strained materials or epitaxially-grown layers that promote strain within the substrate material to modify carrier mobility therein. Strain is induced into a semiconductor material in some embodiments by addition of dopants to the substrate material.

Substrate materials are doped or undoped substrate materials, according to some embodiments, doped substrate materials include at least one p-type and/or n-type dopant depending on the functional and/or performance target parameters for the semiconductor devices being manufactured on the substrate. The term "p-type" refers to the addition of impurities to an intrinsic semiconductor that creates deficiencies of valence electrons. Examples of p-type dopants, i.e., impurities, include, but are not limited to, boron, boron difluoride, gallium, and indium. "N-type" refers to the addition of impurities that contributes free electrons to an intrinsic semiconductor. Examples of n-type dopants, i.e., impurities, include, but are not limited to, antimony, arsenic, and phosphorous. In some embodiments, the semiconductor substrate 702 is doped with p-type dopants such as boron or boron difluoride.

The method 800 also includes an operation 820, wherein a pattern is transferred to a top surface of the substrate layer. In some embodiments, the pattern is transferred to a layer of photoresist. In some embodiments, the pattern is transferred to a hard or soft mask layer after an etch process using a layer of photoresist, the hard or soft mask layer being suitable for transferring the pattern to the substrate material. Mask layers include, according to embodiments, photoresist layers, hard mask layers soft mask layers, hybrid hard/soft mask layers (bilayers) with individual films suited to resisting etch chemistry of a subsequently applied etching process for a substrate material. The pattern includes, in some embodiments, a pattern corresponding to fins 706 of the semiconductor substrate 702.

A type of mask material, and mask layer thickness is regulated by, the chemical composition of the substrate material to which the pattern is transferred during a subsequent etch process. Suitable mask materials include, but are not limited to, polyimide, silicon oxide, silicon nitride, silicon oxynitride, silicon oxycarbide, or combinations thereof, as well as combinations of organic or mixed (organic/inorganic) photosensitive materials or materials sensitive to electron beam epitaxy or other pattern transfer methods.

Mask materials are deposited, according to embodiments of the method, by vapor deposition, including chemical vapor deposition (CVD), physical vapor deposition (PVD), plasma enhanced chemical vapor deposition (PECVD), epitaxial growth, sputtering or other suitable deposition methods.

Pattern transfer to a mask layer is accomplished, by photolithography, electron beam patterning techniques, or other pattern transfer methods known to persons of skill in the art. Photolithographic methods of pattern transfer include operations of depositing (by, e.g., spin coating) photoresist material onto a substrate material, baking (to drive out solvent) the photoresist material, aligning the substrate with an illuminated patterning element of a photolithography tool, exposing the photoresist layer to illumination from the lithography tool, developing the exposed photoresist film to expose a first portion of the substrate material, and cleaning the photoresist material to remove defects prior to pattern transfer from the photoresist into a further mask (e.g., a hard mask or soft mask) or into the substrate. Patterning templates for transferring the pattern to photoresist material include photolithography reticles that selectively interact with illumination from the photolithography or electron beam tool to create patterns of constructive and destructive interference, and to block or allow passage of light/electrons, onto the photoresist or other photosensitive material to receive a pattern predicated on a mask or reticle pattern of the patterning template.

The method 800 further includes operation 830, wherein the pattern is etched into the substrate material. Etching is, according to some embodiments, a dry etch or plasma etch process wherein gaseous or plasma species are directed onto exposed portions of the substrate to react with the substrate material where the mask material is absent. Etching is, according to some embodiments, a wet etching process where a wafer is immersed into, or coated by, a solution with reactive agents that removed exposed portions of the substrate. In plasm etching, mask layers are etched using plasmas generated from gas mixtures comprising at least one halogen-containing gas, and may include one or more of $CF_4$, $SF_6$, $NF_3$, $Cl_2$, $CCl_2F_2$, $SiCl_4$, $BCl_2$, or a combination thereof. Wet etching includes, according to the substrate material being etched, liquid solutions that contain reactant species that consume exposed substrate material where the mask layer is absent. Wet etching processes sometimes include water. According to some embodiments, wet etching processes are free of water in the reactant solution applied to a wafer surface to etch the partially-substrate material. Wet etching processes include one or more of citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), tetramethylammonium hydroxide (TMAH), or a combination thereof, applied to a surface by immersing the substrate (on a semiconductor wafer) into a tank, or by spraying the etchant solution onto a surface. Wet etching processes include, according to some embodiments, neutralizing steps and/or rinsing steps to halt chemical reactions on a wafer surface and/or remove reactant species from the wafer surface to halt substrate removal.

Fins 706, after etching, have a composition matching the composition of the substrate material prior to etching. During some operations, insulating material 707 is deposited into spaces 708 between fins 706. In some operations, the insulating material 707 is recessed so that a lower portion 706A is masked by the insulating material 707, while an upper portion 706B is non masked by the insulating material. The exposed upper portion 706B undergoes doping or implantation in order to modify the electrical characteristics of the exposed portion of semiconductor material in order to adjust electrical characteristics of the cell. Subsequent to doping or implanting the exposed upper portion 706B, a deep isolation structure 710 is formed next to the fins 706. A deep opening is formed in the substrate, having a depth in the substrate 702 that is greater than the depth of the space 708 between the fins 706. The deep opening is then filled with an insulating material to electrically isolate the fins from fins in adjacent cells of the integrated circuit. Subsequent to depositing the insulating material for deep isolation structure 710, the insulating material is recessed, as described above with a wet or plasma etch, and a gate electrode 712 is formed across the exposed upper portion 706B of fins 706.

Other manufacturing processes for integrated circuits having a single size of analog cells, simplification of layout and manufacturing may be achieved by using symmetric spacing of the elements of the analog cell. Symmetric layout of analog cell elements indicate that each cell length and each cell length are the same between adjoining/abutting cells, and that the active areas of each analog cell are aligned with co-linear edges in a first direction (across barrier lines at active area borders) and a second direction (parallel to the barrier lines) that separate analog cell active areas. Analog cell symmetric layout includes a similar separation between one side of the analog cell active area, and the nearest barrier line or isolation structure to that analog cell active area. Such symmetric analog cell layout simplifies manufacturing because photolithographic masking is simplified, and because a mandrel, used to produce sub-lithographic resolution features, may be generated with less line width variation across the array of analog cells in the integrated circuit. Abutting analog cells (i.e., cells that adjoin each other without an intervening barrier line or isolation structure, automatically align both barrier line and active area cell features. However, reliance on only a single size of analog cell may be restrictive in terms of integrated circuit design.

Figure 9:
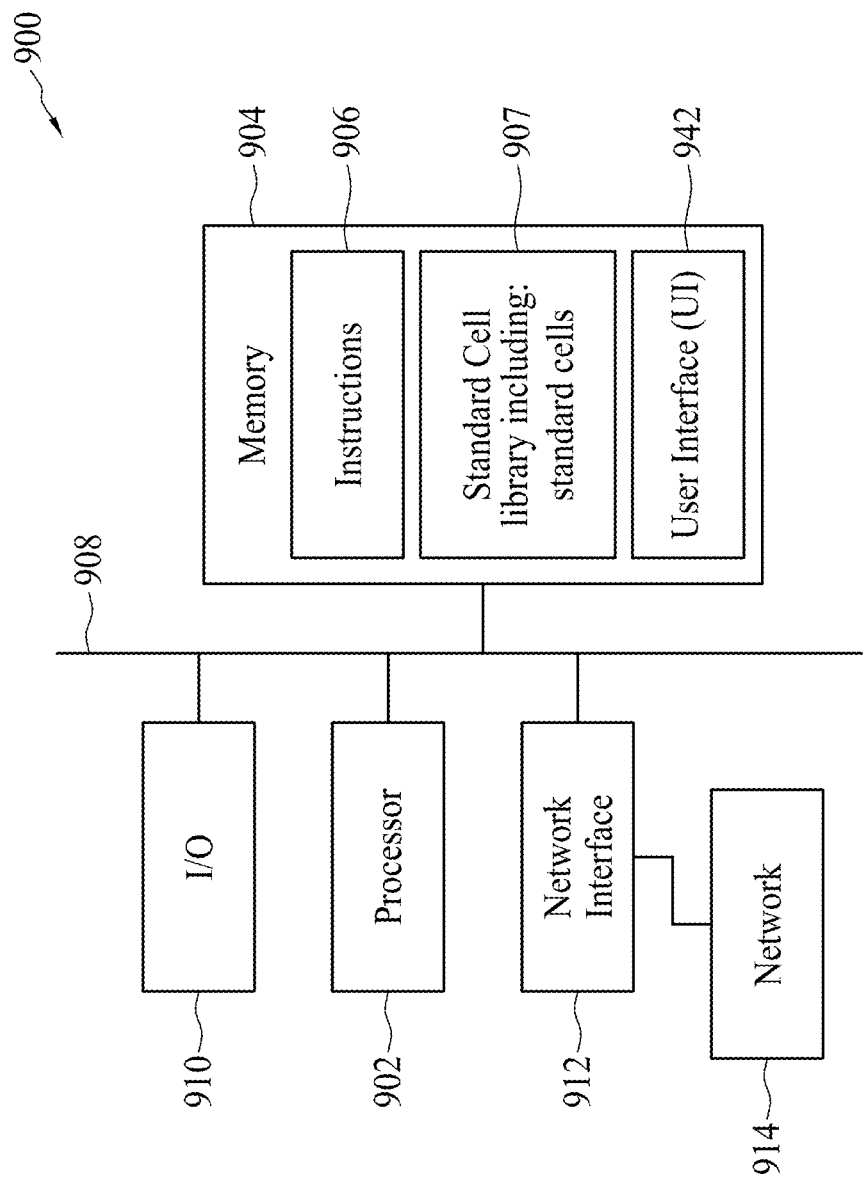
FIG. 9 is a schematic view of a system for designing an integrated circuit layout design according to some embodiments.

FIG. 9 is a block diagram of an electronic design automation (EDA) system 900, in accordance with some embodiments. Methods described herein of generating cell layout diagrams, in accordance with one or more embodiments, are implementable, for example, using EDA system 900, in accordance with some embodiments. In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of, e.g., the methods described herein in accordance with one or more (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
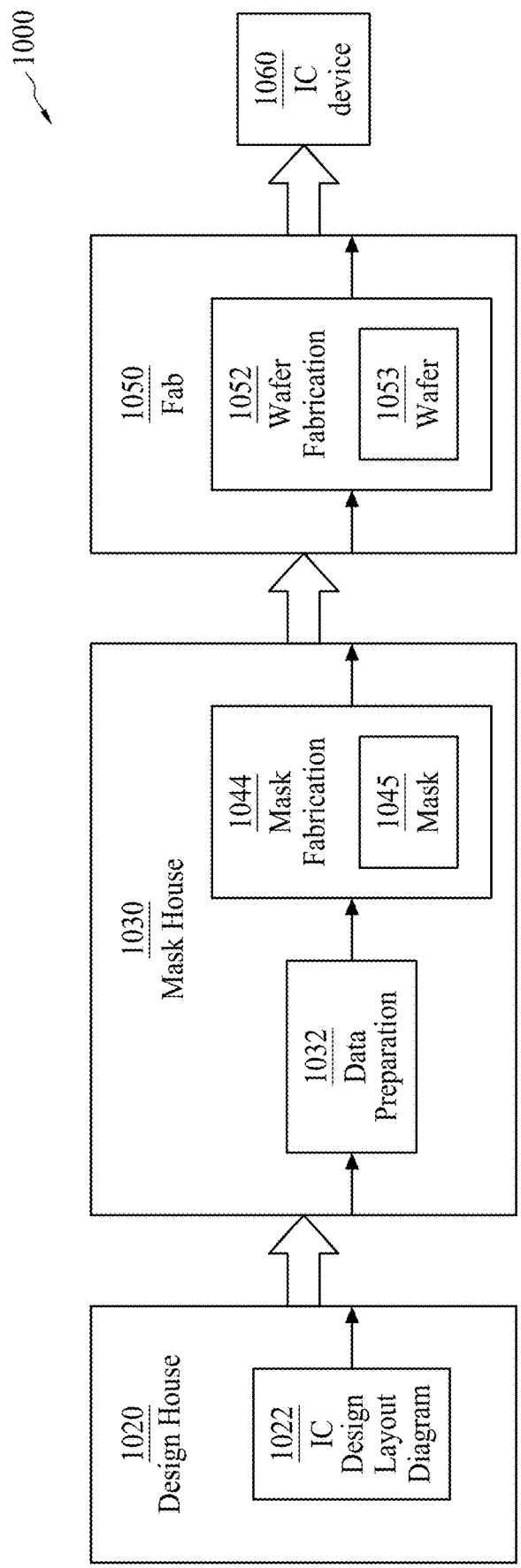
FIG. 10 is a block diagram of a manufacturing system for making integrated circuits, according to some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (e.g., a photomask, or a reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some integrated circuits, analog cells have different cell lengths between barrier lines of the analog cell. Cell length of a standard cell is also referred to as a standard length. A cell length of a non-standard cell may be a fraction of the standard length (e.g., 0.5, 0.3, . . . ) or may be a non-integer multiple (e.g., 1.5, 2.5, . . . ) of the standard length. In an integrated circuit having a plurality of analog cells, some of which have a standard cell size, and some of which have a different cell length (either a fractional length, or a non-integer multiple length), barrier lines or isolation structures of two adjoining cells (in the second direction) sometimes align, but the active areas bordered by the barrier lines/isolation structures have different lengths in the first direction. When the cell lengths of the cells, in the first direction, is the result of a number of fins in the adjoining cells, a high-fin area (e.g., an active area with a larger number of fins) aligns, at one edge, with a lower-fin area (e.g., a "standard cell" or a "normal cell"). In some embodiments of integrated circuits, a number of high-fin active areas in one column adjoins a different number of standard cell active areas in an adjoining column, and the overall length of the first number of high-fin active areas, or cells, is the same as the second number of standard cells, in the adjoining column. The top-most and bottom-most barrier lines of the cells in each column align, while the intermediate barrier lines, or isolation structures, in each column only sometimes align with a barrier line or isolation in the adjoining column. A symmetric layout occurs when the number and size of each active area (or portion of the active area) in the adjoining columns is symmetric with respect to a centerline located midway between the top and bottom barrier lines of the active areas of the two columns. The centerline between the top and bottom barrier lines is called a mirror line.

Deliberate vertical asymmetry, within a single cell of an integrated circuit, of the active area of the cell, between top and bottom edges of the cell, in order to align an edge or border of the active area with an edge or border of an active area in a different column of the integrated circuit, promotes higher yields of integrated circuit manufacturing process and reduces dimensional variation among cell elements in the integrated circuit. Vertically asymmetric cells are arranged in pairs with mirroring symmetry (also called flipped symmetry) across a shared or mirrored cell boundary to promote reduced-defect manufacturing processes and to simplify layout of integrated circuits having cells with vertical asymmetry.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first cell in a first column, wherein the first cell comprises:
a first length in a first direction,
a first barrier line extending in a second direction,
a second barrier line extending in the second direction, and
a first cell active area between the first barrier line and the second barrier line;
a second cell in a second column, wherein the second cell comprises:
a second length in the first direction,
a third barrier line extending in the second direction,
a fourth barrier line extending in the second direction, and
a second cell active area between the third barrier line and the fourth barrier line,
wherein the first cell active area is asymmetrically offset along the first direction between the first barrier line and the second barrier line, and the second cell active area is asymmetrically offset along the first direction between the third barrier line and the fourth barrier line, wherein the first length is three times the second length.

2. The semiconductor device of claim 1, further comprising a third cell in the second column, the third cell comprising:
the second length in the first direction,
a fifth barrier line,
a sixth barrier line aligned with the second barrier line, and
a third cell active area between the fifth barrier line and the sixth barrier line, wherein the third cell active area is asymmetric between the fifth barrier line and the sixth barrier line.

3. The semiconductor device of claim 2, wherein a bottom edge of the first cell active area is aligned in the second direction with a bottom edge of the third cell active area.

4. The semiconductor device of claim 3, wherein the bottom edge of the first cell active area is a first separation distance away from the second barrier line, a bottom edge of the second cell active area is the first separation distance away from the fourth barrier line, and the bottom edge of the third cell active area is the first separation distance from the sixth barrier line.

5. The semiconductor device of claim 1, wherein a top edge of the first cell active area is a second separation distance away from the first barrier line, a top edge of the second cell active area is the second separation distance away from the third barrier line, and the first separation distance is larger than the second separation distance.

6. The semiconductor device of claim 1, wherein a top edge of the first cell active area is a second separation distance away from the first barrier line, a top edge of the second cell active area is the second separation distance away from the third barrier line, and the second separation distance is larger than the first separation distance.

7. The semiconductor device of claim 2, wherein a top edge of the first cell active area is aligned in the second direction with a top edge of the second cell active area.

8. The semiconductor device of claim 7, wherein the top edge of the first cell active area is a second separation distance away from the first barrier line, the top edge of the second cell active area is the second separation distance away from the third barrier line, and the top edge of the third cell active area is the second separation distance away from the fifth barrier line.

9. The semiconductor device of claim 8, wherein a bottom edge of the first cell active area is a second separation distance away from the second barrier line, a bottom edge of the second cell active area is the second separation distance away from the fourth barrier line, and the first separation distance is larger than the second separation distance.

10. The semiconductor device of claim 9, wherein a bottom edge of the first cell active area is a second separation distance away from the second barrier line, a bottom edge of the second cell active area is the second separation distance away from the fourth barrier line, and the second separation distance is larger than the first separation distance.

11. The semiconductor device of claim 2, further comprising a fourth cell active area between the fourth barrier line and the fifth barrier line, wherein the fourth cell active area is asymmetrically offset toward the second cell.

12. A semiconductor device, comprising:
a first cell in a first column, wherein the first cell comprises:
a first length in a first direction,
a first barrier line extending in a second direction,
a second barrier line extending in the second direction, and
a first cell active area between the first barrier line and the second barrier line,
wherein the first cell active area comprises a first number of fins, and a first distance from the first cell active area to the first barrier line is different from a second distance from the first cell active area to the second barrier line;
a second cell in a second column, wherein the second cell comprises:
a second length in the first direction,
a third barrier line extending in the second direction,
a fourth barrier line extending in the second direction, and
a second cell active area between the third barrier line and the fourth barrier line,
wherein the second cell has a second number of fins, and the third barrier line is aligned with the first barrier line in the first direction.

13. The semiconductor device of claim 12, wherein the second cell active area is asymmetrically offset along the first direction between the third barrier line and the fourth barrier line.

14. The semiconductor device of claim 12, wherein the first length is three times the second length.

15. The semiconductor device of claim 12, further comprising a third cell having a third cell active area, wherein the third cell has a fifth barrier line, and the first number of fins in the third cell active area.

16. The semiconductor device of claim 15, wherein a third distance from the third cell active area to the fifth barrier line is equal to the first distance.

17. The semiconductor device of claim 15, wherein the third cell shares the second barrier line with the first cell.

18. The semiconductor device of claim 17, wherein a third distance form the third cell active area to the second barrier line is equal to the second distance.

19. The semiconductor device of claim 12, wherein the first cell abuts the second cell.

20. The semiconductor device of claim 12, wherein the first cell is spaced from the second cell.

* * * * *